United States Patent
Jia et al.

(10) Patent No.: US 10,674,616 B2
(45) Date of Patent: Jun. 2, 2020

(54) DISPLAY DEVICE

(71) Applicants: BOE Technology Group Co., Ltd., Beijing (CN); Beijing BOE Multimedia Technology Co., Ltd., Beijing (CN)

(72) Inventors: Xinhua Jia, Beijing (CN); Huijun Li, Beijing (CN)

(73) Assignees: BOE TECHNOLOGY GROUP CO., LTD., Beijing (CN); BEIJING BOE MULTIMEDIA TECHNOLOGY CO., LTD., Beijing (CN)

( * ) Notice: Subject to any disclaimer, the term of this patent is extended or adjusted under 35 U.S.C. 154(b) by 229 days.

(21) Appl. No.: 15/122,171

(22) PCT Filed: Mar. 27, 2015

(86) PCT No.: PCT/CN2015/075288
§ 371 (c)(1),
(2) Date: Aug. 28, 2016

(87) PCT Pub. No.: WO2016/065835
PCT Pub. Date: May 6, 2016

(65) Prior Publication Data
US 2017/0006714 A1    Jan. 5, 2017

(30) Foreign Application Priority Data
Oct. 29, 2014 (CN) .................... 2014 2 0634409 U

(51) Int. Cl.
*H05K 5/00* (2006.01)
*H05K 5/02* (2006.01)
*A47B 97/00* (2006.01)

(52) U.S. Cl.
CPC ......... *H05K 5/0017* (2013.01); *A47B 97/001* (2013.01); *H05K 5/0204* (2013.01)

(58) Field of Classification Search
CPC ...... H05K 5/0017; H05K 5/0204; H05K 5/00; H05K 5/02; H05K 7/00; H05K 7/16;
(Continued)

(56) References Cited

U.S. PATENT DOCUMENTS 2,165,724 A * 7/1939 Page .................... G09F 15/0012
40/606.09
3,844,416 A * 10/1974 Potter .................... A47B 47/02
211/162

(Continued)

FOREIGN PATENT DOCUMENTS

| CN | 201655173 U | 11/2010 |
|---|---|---|
| EP | 1 841 304 A1 | 10/2007 |
| JP | 2007206278 A * | 8/2007 |

OTHER PUBLICATIONS

International Search Report and Written Opinion, including English translation of Box No. V, for International Application No. PCT/CN2015/075288, dated Jul. 31, 2015, 11 pages.

*Primary Examiner* — Rockshana D Chowdhury
(74) *Attorney, Agent, or Firm* — Westman, Champlin & Koehler, P.A.

(57) ABSTRACT

Disclosed is a display device which is capable of being selectively placed in a desk-mounted manner or a wall-mounted manner so that it has a good utility. The display device includes: a display screen on which a first mounting member and a second mounting member are provided; and a mounting base on which a wall-mounted member is provided. The display screen may be supported by the mounting base in a horizontal plane when the mounting base is connected to the first mounting member on the display screen via a first connecting member, and the display screen may be supported by the mounting base in a wall plane with its wall-mounted member being connected to the wall when the mounting base is connected to the second mounting (Continued)

member on the display screen via a second connecting member.

18 Claims, 4 Drawing Sheets

(58) Field of Classification Search
CPC ....... A47B 97/001; G06F 1/1601; G06F 1/16; G06F 2200/1612; G06F 1/1637; G06F 2200/1633
See application file for complete search history.

(56) References Cited

U.S. PATENT DOCUMENTS

| | | | |
|---|---|---|---|
| 7,495,897 B2* | 2/2009 | Yokawa | F16M 11/22 248/918 |
| 7,639,483 B2* | 12/2009 | Chen | F16M 11/10 248/923 |
| 9,560,775 B2* | 1/2017 | Park | H04N 5/64 |
| 10,221,898 B2* | 3/2019 | Castillo | G06F 1/1601 |
| 2003/0015632 A1* | 1/2003 | Dunn | A47B 81/065 248/122.1 |
| 2004/0008476 A1* | 1/2004 | Cheng | G06F 1/1601 361/679.27 |
| 2004/0012917 A1* | 1/2004 | Jung | F16M 11/10 361/679.02 |
| 2011/0128229 A1* | 6/2011 | Lee | G06F 1/1616 345/168 |
| 2012/0140410 A1* | 6/2012 | Chen | G06F 1/1616 361/679.55 |
| 2013/0128420 A1* | 5/2013 | Kuo | H04N 5/64 361/679.01 |

* cited by examiner

DISPLAY DEVICE

CROSS-REFERENCE TO RELATED APPLICATIONS

This application is a Section 371 National Stage Application of International Application No. PCT/CN2015/075288, filed on Mar. 27, 2015 and entitled with "DISPLAY DEVICE", which claims priority to Chinese Application No. 201420634409.4, filed on Oct. 29, 2014, which are incorporated herein by reference in their entirety.

BACKGROUND OF THE INVENTION

Field of the Invention

Embodiments of the present disclosure relate to a technical field of display device, in particular, to a display device.

Description of the Related Art

With a development of display technology, there is a growing demand on utilities of a display device.

In prior art, the display devices mainly include a desk-mounted type of display device and a wall-mounted type of display device. Specifically, the desk-mounted type of display device can only be placed in a horizontal plane, and a user needs to buy an additional wall-mounted support if he wants to mount the display device in a wall-mounted manner. Moreover, the wall-mounted type of display device can only be placed in a wall-mounted manner, and the user needs to buy an additional support base if he wants to mount the display device in the horizontal plane. Therefore, the existing display devices have limited placement arrangements.

SUMMARY OF THE INVENTION

Embodiments of the present disclosure provide a display device and a mounting base for the display device, which enable the display device to be placed in both a desk-mounted manner and a wall-mounted manner, so as to improve the utilities of the display device.

To this end, the present disclosure provides the following solutions.

According to an aspect of the present disclosure, it is provided a display device, comprising:

a display screen on which a second threaded hole and a third threaded hole are provided to arrange the display screen in a first mounting position and a second mounting position, respectively; and a mounting base on which a wall-mounted member is provided, wherein, the display screen is supported by the mounting base in a horizontal plane when the mounting base is connected to the second threaded hole on the display screen via a first connecting member, such that the display screen is arranged in the first mounting position, and the display screen is supported by the mounting base in a wall plane with its wall-mounted member being connected to the wall when the mounting base is connected to the third threaded hole on the display screen via a second connecting member, such that the display screen is arranged in the second mounting position.

According to another aspect of the present disclosure, it is further provided a mounting base for a display device, the mounting base being provided with a wall-mounted member, wherein, the display device is supported by the mounting base in a horizontal plane when the mounting base is connected to a second threaded hole on the display device, such that the display device is arranged in a first mounting position, and the display device is supported by the mounting base in a wall plane with its wall-mounted member being connected to the wall when the mounting base is connected to a third threaded hole on the display device, such that the display device is arranged in a second mounting position.

In an optional embodiment, the wall-mounted member comprises at least one wall-mounted slot.

In an optional embodiment, the wall-mounted member comprises a wall-mounted slot which is formed by a hollow structure inside the mounting base.

In an optional embodiment, the or each wall-mounted slot is provided with at least one snap-in slot, and the display device further comprises a wall-mounted adapter which is detachably mounted on the wall, and wherein the wall-mounted adapter is provided with a protrusion which is in one-to-one correspondence with the snap-in slot in the mounting base and is allowed to be engaged with the corresponding snap-in slot in a snap fit. In an optional embodiment, the mounting base may be a metallic mounting base, and/or the wall-mounted adapter may be a metallic wall-mounted adapter. In an optional embodiment, the metallic wall-mounted adapter further comprises a first protective layer provided on a surface of the metallic wall-mounted adapter; and/or the metallic mounting base further comprises a second protective layer provided on a surface of the metallic mounting base. In an optional embodiment, the wall-mounted slot is provided with a wall-mounted lug at its side, and the wall-mounted lug is provided with a first threaded hole such that the mounting base may be connected with the wall via a screw.

In an optional embodiment, both the first connecting member and the second connecting member comprise screws.

In an optional embodiment, a printed circuit board cassette is provided at a side of the display screen away from its display surface, and the second threaded hole is provided in the printed circuit board cassette.

In an optional embodiment, the third threaded hole is provided at a side of the display screen away from its display surface.

In an optional embodiment, a side of the mounting base is provided with a securing lug for mounting the mounting base onto the second threaded hole or the third threaded hole, and the securing lug is provided with a fourth threaded hole.

In the display device according to the present disclosure, the mounting base is detachable such that it can be selectively secured onto the second threaded hole or the third threaded hole on the display screen as required. Moreover, due to the wall-mounted member on the mounting base, the mounting base can be selectively used as a support base or a wall-mounted support. Specifically, the mounting base can support the display device in a horizontal plane when the mounting base is connected to the second threaded hole on the display device via the first connecting member, and the mounting base can support the display device in a wall plane with its wall-mounted member being connected to the wall when the mounting base is connected to the third threaded hole on the display device via the second connecting member.

Thus, the display device and the mounting base according to the embodiments of the present disclosure enable the display device to be selectively placed in a desk-mounted manner or a wall-mounted manner, so that they have a good utility.

LIST OF REFERENCE NUMERALS

| 1: display screen; | 11: third threaded hole; |
| --- | --- |
| 2: printed circuit board cassette; | 3: mounting base; |
| 31: wall-mounted member; | 311: bayonet; |
| 32: wall-mounted lug; | 321: first threaded hole; |
| 33: securing lug; | 331: fourth threaded hole; |
| 4: wall-mounted adapter; | 41: protrusion. |

DETAILED DESCRIPTION OF PREFERRED EMBODIMENTS OF THE INVENTION

Technical solutions according to the embodiments of the present disclosure will be described clearly and completely in conjunction with the following accompanying drawings. Obviously, the described embodiments are merely a part of the embodiments of the present disclosure, rather than all of the embodiments. All other embodiments obtained by those skilled in the art without making creative works based on the embodiments of the present disclosure will fall into the scope of the present disclosure.

Figure 1:
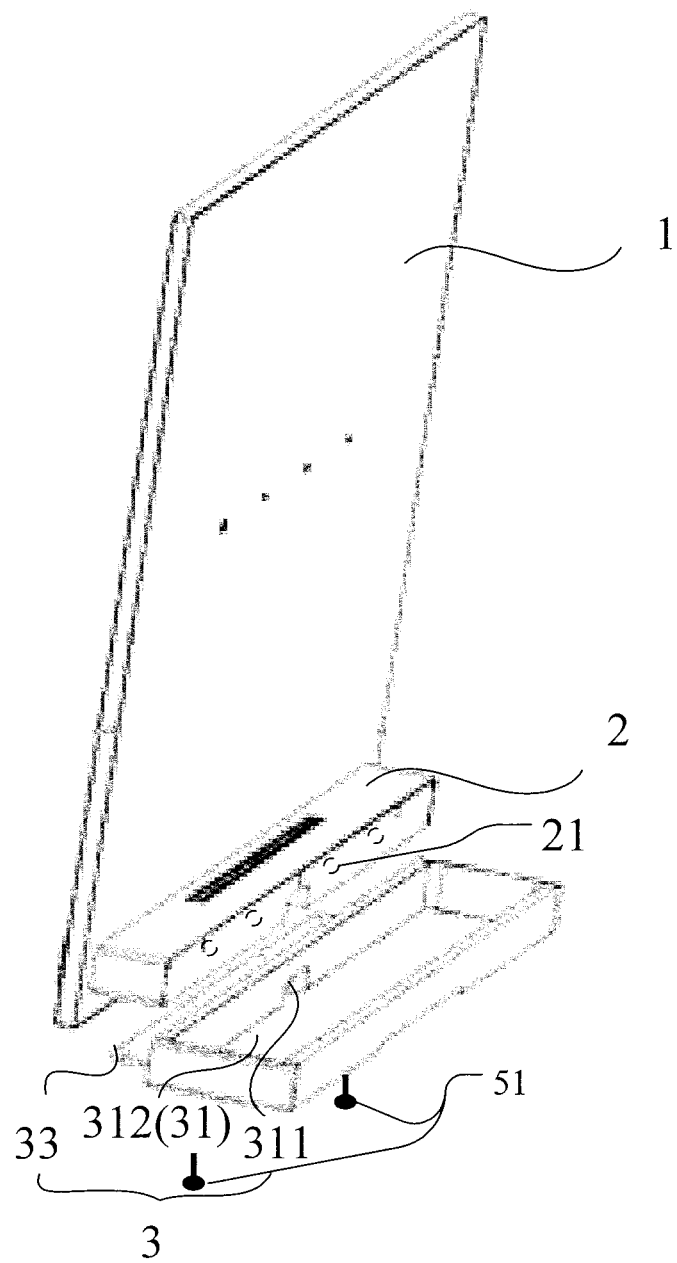
FIG. 1 is a schematic exploded view of a part of structures of a display device according to an embodiment of the present disclosure.
Figure 2:
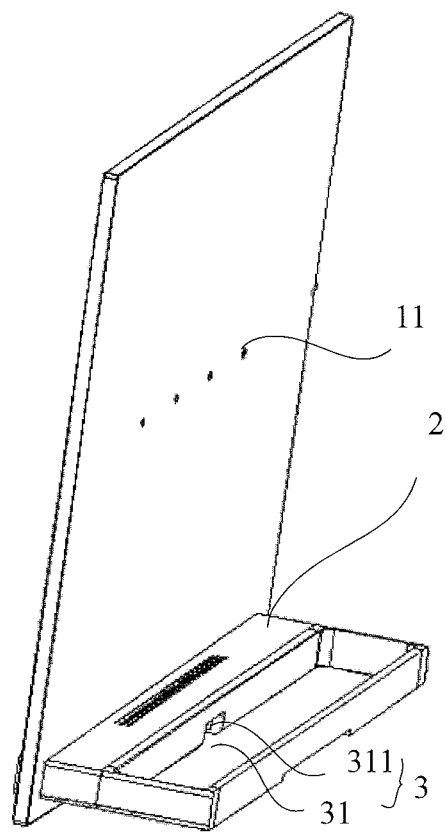
FIG. 2 is a schematic view showing a position of the display device according to the embodiment of the present disclosure.
Figure 3:
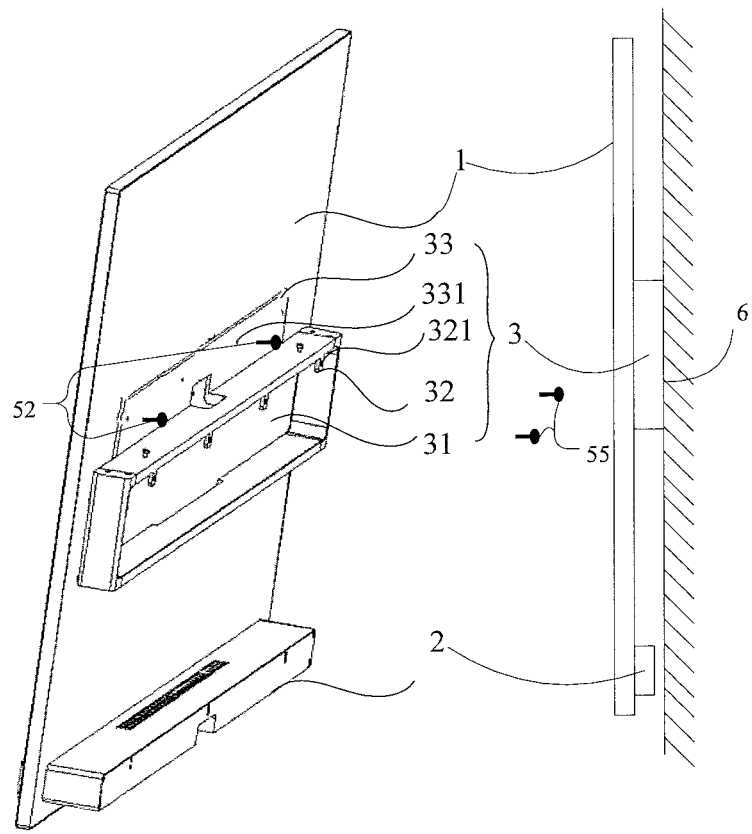
FIG. 3 is a schematic view showing another position of the display device according to the embodiment of the present disclosure.

As shown in FIGS. 1, 2 and 3, FIG. 1 is a schematic exploded view of a part of components of a display device according to an embodiment of the present disclosure, FIG. 2 is a schematic view showing a position of the display device according to the embodiment of the present disclosure, in which the display device is arranged in a first mounting position (i.e. a desk-mounted position), and FIG. 3 is a schematic view showing another position of the display device according to the embodiment of the present disclosure, in which the display device is arranged in a second mounting position (i.e. a wall-mounted position). The display device according to the embodiment of the present disclosure specifically comprises:

a display screen 1 on which a second threaded hole 21 and a third threaded hole 11 are provided to arrange the display screen in a first mounting position (see FIG. 2) and a second mounting position (see FIG. 3), respectively; and a mounting base 3 on which a wall-mounted member 31 is provided, wherein, as shown in FIG. 2, the display screen may be supported by the mounting base 3 in a horizontal plane when the mounting base 3 is connected to the second threaded hole 21 on the display screen 1 via a first connecting member 51, such that the display screen 1 is arranged in the first mounting position, and in FIG. 3, as shown in FIG. 3, the display screen may be supported by the mounting base 3 in a wall plane with its wall-mounted member 31 being connected to the wall 6 when the mounting base 3 is connected to the third threaded hole 11 on the display screen 1 via a second connecting member 52, such that the display screen 1 is arranged in the second mounting position.

In the display device according to the embodiment of the present disclosure, the mounting base 3 is configured to be detachable, so that the mounting base 3 can be selectively mounted on the second threaded hole or the third threaded hole of the display device depending on an actual requirement, thereby selectively arranging the display device in a first mounting position or a second mounting position. Due to the wall-mounted member 31 on the mounting base 3, the mounting base 3 may be selectively used as a support base or a wall-mounted support. Specifically, as shown in FIG. 2, the display device can be supported by the mounting base 3 in the horizontal plane when the mounting base 3 is connected to the second threaded hole on the display screen 1 via the first connecting member; as shown in FIG. 3, the display device can be supported by the mounting base 3 in the wall plane with its wall-mounted member 31 being connected to the wall when the mounting base 3 is connected to the third threaded hole on the display screen 1 via the second connecting member.

Thus, the display device according to the embodiment of the present disclosure can be selectively supported in a desk-mounted manner or a wall-mounted manner, so that it has a good utility.

The wall-mounted member 31 may have various types of specific structures. For example, in a specific implementation, the wall-mounted member 31 may comprise at least one wall-mounted slot 312, correspondingly, a structure engaging with the wall-mounted slot, such as a hanger or the like, may be provided on the wall.

Figure 4:
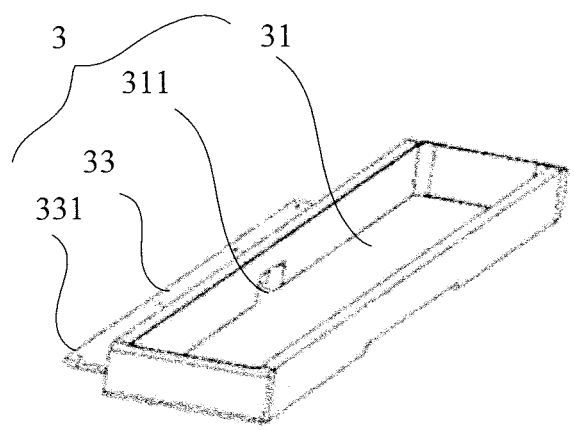
FIG. 4 is a schematic view of a first structure of a mounting base of the display device according to the embodiment of the present disclosure.

Optionally, as shown in FIG. 4, FIG. 4 is a schematic view of the mounting base of the display device with a first type of structure according to the embodiment of the present disclosure, the wall-mounted member 31 comprises a wall-mounted slot. Specifically, there is a hollow structure inside the mounting base 3 to form the wall-mounted slot. The hollow structure is helpful to reduce an entire weight of the mounting base 3 and save material.

Figure 5:
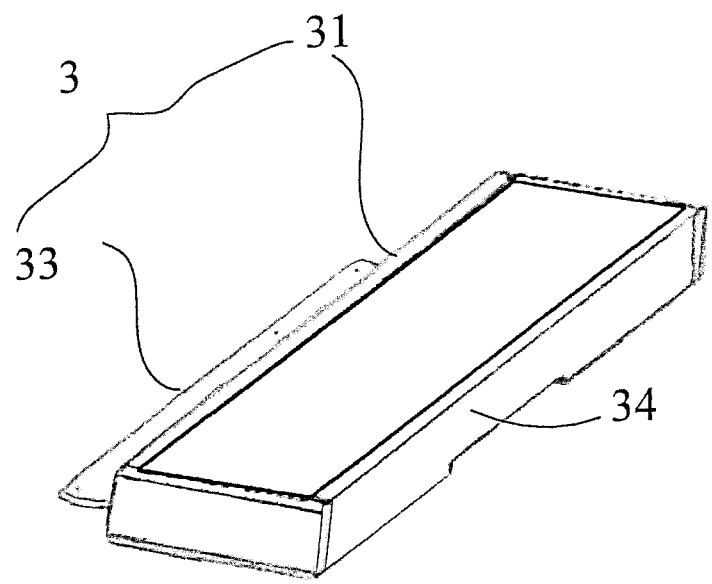
FIG. 5 is a schematic view of a second structure of a mounting base of the display device according to the embodiment of the present disclosure.

Optionally, as shown in FIG. 5, FIG. 5 is a schematic view of the mounting base of the display device with a second type of structure according to the embodiment of the present disclosure, the mounting base 3 has a solid structure, and the wall-mounted slots are provided at four sides of the mounting base.

Optionally, the mounting base may have a solid structure, and a plurality of wall-mounted slots spaced apart from each other are distributed in the mounting base.

Figure 6:
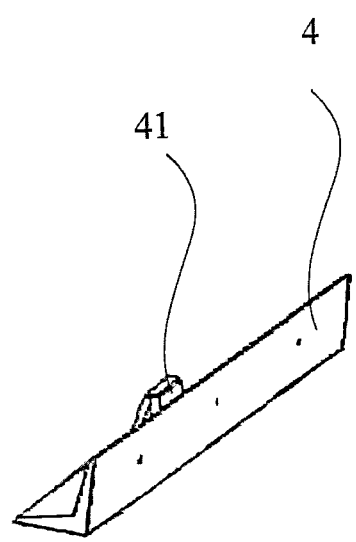
FIG. 6 is a schematic structural view of a wall-mounted adapter of the display device according to the embodiment of the present disclosure.

According to a further embodiment of the present disclosure, as shown in FIG. 4, the wall-mounted slot each is provided with at least one snap-in slot 311 therein, in order to improve a stability for mounting the display device in a wall-mounted manner. Moreover, as shown in FIG. 6, FIG. 6 is a schematic structural view of a wall-mounted adapter of the display device according to the embodiment of the present disclosure, the display device may further comprise a wall-mounted adapter 4 which is detachably mounted on the wall. The wall-mounted adapter 4 is provided with at least one protrusion 41, which is in one-to-one correspondence with the at least one snap-in slot 311 in the mounting base 3 and can be engaged with the corresponding snap-in slot 311 in a snap fit. The protrusion 41 may protrude upward as shown in FIG. 6, correspondingly, the snap-in slot 311 engaging with the protrusion 41 may be disposed in an inner wall of the wall-mounted slot. Alternatively, the protrusion 41 may protrude towards the display screen, correspondingly, the snap-in slot 311 may be disposed in a side of the wall-mounted slot which is adjacent to the display device and opposite to the display screen.

The wall-mounted adapter and the mounting base may be made of various types of materials, and they may be made of different types of materials or the same type of material.

Optionally, the wall-mounted adapter may be made of metal. Obviously, the wall-mounted adapter may also be made of any other materials having high strength and hardness, which are not described in details here.

Further, the metallic wall-mounted adapter may comprise a first protective layer provided on a surface of the metallic wall-mounted adapter. The first protective layer may be configured to prevent metal oxidization while improving an appearance of the metallic wall-mounted adapter. The first protective layer may comprise a paint layer formed on the metallic wall-mounted adapter by using a paint spraying process, or an electroplated layer.

Optionally, the mounting base may also be made of metal. Obviously, the mounting base may also be made of any other materials having high strength and hardness, which are not repeated here.

Further, as shown in FIG. 5, the metallic mounting base may comprise a second protective layer 34 provided on a surface of the metallic mounting base. The second protective layer may be configured to prevent metal oxidization while improving an appearance of the metallic mounting base. The second protective layer may comprise a paint layer formed on the metallic mounting base by using paint spraying process, or an electroplated layer.

Optionally, both the mounting base and the wall-mounted adapter may be made of metal.

In another optional embodiment, the wall-mounted slot is provided with a wall-mounted lug 32 at its side, and the wall-mounted lug 32 is provided with a first threaded hole 321 such that the mounting base 3 may be connected with the wall via a screw 55, that is, the mounting base 3 may be secured onto the wall via a screw 55. During mounting the display device, the mounting base may be firstly secured onto the wall, then the display screen may be secured onto the mounting base.

The mounting base 3 may be mounted onto the first or third threaded hole on the display screen in various manners, for example, the mounting base 3 may be connected to the display screen in a snap fit.

Optionally, the mounting base may be mounted onto the display screen via screws, in this case, both the first connecting member and the second connecting member are screws.

The second threaded hole and the third threaded hole may be located at a number of different particular positions on the display screen.

In an optional embodiment, a printed circuit board cassette 2 is provided at a side of the display screen away from its display surface, and the second threaded hole is provided in the printed circuit board cassette. The second threaded hole may be located at a bottom of the printed circuit board cassette, alternatively, may be located at a side of the printed circuit board cassette away from the display surface of the display screen.

In an optional embodiment, the third threaded hole is provided at a side of the display screen 1 away from its display surface.

In an optional embodiment, as shown in FIG. 4, a side of the mounting base 3 is provided with a securing lug 33 for mounting the mounting base 3 onto the second threaded hole or the third threaded hole. The securing lug 33 is provided with a fourth threaded hole 331. This arrangement of the securing lug 33 is helpful to mount the mounting base 3.

The display device may be a liquid crystal television, or other devices with display function, such as a computer or the like, which are not described in details here.

It is obvious for those skilled in the art that various changes and modifications may be made to the embodiments of the present invention without departing the spirit and scope of the present invention. Thus, these changes and modifications are intended to be included in the present invention if these changes and modifications fall into the scope defined by appended claims and equivalents thereof.

What is claimed is:

1. A display device, comprising:
   a display screen on which a third threaded hole is provided to arrange the display screen in a second mounting position;
   a printed circuit board cassette, provided at a side of the display screen away from a display surface, on which a second threaded hole are provided to arrange the display screen in a first mounting position; and
   a mounting base on which a wall-mounted member is provided, wherein,
   the display screen is supported by the mounting base in a horizontal plane when the mounting base is connected to the second threaded hole on the display screen via a first screw, such that the display screen is arranged in the first mounting position, and
   the display screen is supported by the mounting base in a wall plane with a wall-mounted member being connected to a wall when the mounting base is connected to the third threaded hole on the display screen via a second screw, such that the display screen is arranged in the second mounting position,
   wherein the printed circuit board cassette is provided at a lower end of a surface of the side of the display screen, the second threaded hole is provided in a surface of the printed circuit board cassette away from the display surface of the display screen.

2. The display device according to claim 1, wherein the wall-mounted member comprises at least one wall-mounted slot.

3. The display device according to claim 2, wherein, the at least one wall-mounted slot is provided with at least one snap-in slot, and the display device further comprises a wall-mounted adapter which is detachably mounted on the wall, and wherein the wall-mounted adapter is provided with a protrusion which is in one-to-one correspondence with the snap-in slot in the mounting base and is allowed to be engaged with the corresponding snap-in slot in a snap fit.

4. The display device according to claim 3, wherein the mounting base is a metallic mounting base, and/or the wall-mounted adapter is a metallic wall-mounted adapter.

5. The display device according to claim 4, wherein, the metallic wall-mounted adapter further comprises a first protective layer provided on a surface of the metallic wall-mounted adapter; and/or the metallic mounting base further comprises a second protective layer provided on a surface of the metallic mounting base.

6. The display device according to claim 1, wherein the wall-mounted member comprises a wall-mounted slot which is formed by a hollow structure inside the mounting base.

7. The display device according to claim 6, wherein, the or each wall-mounted slot is provided with at least one snap-in slot, and the display device further comprises a wall-mounted adapter which is detachably mounted on the wall, and wherein the wall-mounted adapter is provided with a protrusion which is in one-to-one correspondence with the snap-in slot in the mounting base and is allowed to be engaged with the corresponding snap-in slot in a snap fit.

8. The display device according to claim 6, wherein, the at least one wall-mounted slot is provided with a wall-mounted lug at a side, and the wall-mounted lug is provided with a first threaded hole such that the mounting base is allowed to be connected with the wall via a screw.

9. The display device according to claim 1, wherein, the third threaded hole is provided at the side of the display screen away from the display surface of the display screen.

10. The display device according to claim 1, wherein, a side of the mounting base is provided with a securing lug for mounting the mounting base onto the second threaded hole or the third threaded hole, and the securing lug is provided with a fourth threaded hole.

11. A mounting base for a display device, comprising a wall-mounted member, wherein,
the display device is supported by the mounting base in a horizontal plane when the mounting base is connected to a second threaded hole on the display device, such that the display device is arranged in a first mounting position, and
the display device is supported by the mounting base in a wall plane with a wall-mounted member being connected to the wall when the mounting base is connected to a third threaded hole on the display device, such that the display device is arranged in a second mounting position,
wherein the display device comprises a display screen and a printed circuit board cassette provided at a side of the display screen away from a display surface, the printed circuit board cassette is provided at a lower end of a surface of the side of the display screen, the second threaded hole is provided in a surface of the printed circuit board cassette away from the display surface of the display screen.

12. The mounting base according to claim 11, wherein the wall-mounted member comprises at least one wall-mounted slot.

13. The mounting base according to claim 11, wherein the wall-mounted member comprises a wall-mounted slot which is formed by a hollow structure inside the mounting base.

14. The mounting base according to claim 12, wherein, the at least one wall-mounted slot is provided with at least one snap-in slot.

15. The mounting base according to claim 14, wherein the mounting base is a metallic mounting base.

16. The mounting base according to claim 15, wherein, the metallic mounting base further comprises a protective layer provided on a surface of the metallic mounting base.

17. The mounting base according to claim 12, wherein, the at least one wall-mounted slot is provided with a wall-mounted lug at a side, and the wall-mounted lug is provided with a first threaded hole such that the mounting base is allowed to be connected with the wall via a screw.

18. The mounting base according to claim 11, wherein, a side of the mounting base is provided with a securing lug for mounting the mounting base onto the second threaded hole or the third threaded hole, and the securing lug is provided with a fourth threaded hole.

* * * * *